(12) United States Patent
Hsu et al.

(10) Patent No.: US 9,548,234 B2
(45) Date of Patent: *Jan. 17, 2017

(54) PACKAGE SUBSTRATE AND FLIP-CHIP PACKAGE CIRCUIT INCLUDING THE SAME

(71) Applicant: PHOENIX PIONEER TECHNOLOGY CO., LTD., Hsinchu County (TW)

(72) Inventors: Che-Wei Hsu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 190 days.

This patent is subject to a terminal disclaimer.

(21) Appl. No.: 14/521,812

(22) Filed: Oct. 23, 2014

(65) Prior Publication Data

US 2016/0118327 A1   Apr. 28, 2016

(30) Foreign Application Priority Data

Jun. 17, 2014   (TW) .............................. 103120893 A

(51) Int. Cl.
| | |
|---|---|
| H05K 1/18 | (2006.01) |
| H01L 21/683 | (2006.01) |
| H01L 23/498 | (2006.01) |
| H01L 21/48 | (2006.01) |
| H01L 23/31 | (2006.01) |

(52) U.S. Cl.
CPC ......... *H01L 21/6835* (2013.01); *H01L 21/486* (2013.01); *H01L 21/4857* (2013.01); *H01L 23/31* (2013.01); *H01L 23/49822* (2013.01); *H01L 23/49827* (2013.01); *H01L 23/49816* (2013.01); *H01L 23/49894* (2013.01); *H01L 2221/68345* (2013.01); *H01L 2924/0002* (2013.01)

(58) Field of Classification Search
USPC .......................................... 361/764; 174/251
See application file for complete search history.

(56) References Cited

U.S. PATENT DOCUMENTS

| | | | | |
|---|---|---|---|---|
| 2012/0074585 A1* | 3/2012 | Koo | ...................... | H01L 21/486 |
| | | | | 257/774 |
| 2014/0054763 A1* | 2/2014 | Woychik | ................. | H01L 24/11 |
| | | | | 257/737 |
| 2015/0069623 A1* | 3/2015 | Tsai | ...................... | H01L 21/563 |
| | | | | 257/774 |

* cited by examiner

*Primary Examiner* — Andargie M Aychillhum
(74) *Attorney, Agent, or Firm* — WPAT, PC; Justin King; Jonathan Chiang

(57) ABSTRACT

This disclosure provides a package substrate, a flip-chip package circuit and their fabrication method. The package substrate includes: a first wiring layer having a first metal wire and a first dielectric material layer filling the remaining part of the first wiring layer except for the first metal wire; a conductive pillar layer formed on the first wiring layer and including a metal pillar connected to the first metal wire, a molding compound layer with a protrusion part surrounding the metal pillar, and a second dielectric material layer formed on the molding compound layer; a second wiring layer formed on the conductive pillar layer and including a second metal wire connected to the metal pillar; and a protection layer formed on the second wiring layer.

9 Claims, 5 Drawing Sheets

PACKAGE SUBSTRATE AND FLIP-CHIP PACKAGE CIRCUIT INCLUDING THE SAME

This application claims the benefit of Taiwan application Serial No. 103120893, filed on Jun. 17, 2014, and the disclosure of which is incorporated by reference herein in its entirety.

TECHNICAL FIELD

The present disclosure relates to a package substrate, a flip-chip package circuit, and their fabrication methods.

TECHNICAL BACKGROUND

A next-generation electronic product is asked to have multiple functions and high-speed performance other than compactness. The integrated-circuit manufacturers have moved to smaller design rules to make chips with much more electronic devices. On the other hand, the techniques for packaging the chips or semiconductor substrates have also been developed for the same purpose.

Conventionally, a flip-chip chip size package (FCCSP) substrate 10 used to construct the so-called "molded interconnection substrate (MIS)" can be illustrated in FIG. 1. A photo-sensitive primer material can be used in the formation of the dielectric material layer 17 on the molding compound layer 16, so it is required to have a high resolution of photolithography in microfabrication. Especially for the package manufacturing process of fine pitch, the primer material is expensive and restricted to some specific chemical compositions. Moreover, the metal pillar which connects the upper-layer conductive wires 14 and the lower-layer conductive wires 12 of the package substrate 10 includes two segments 18 and 19. These two segments 18 and 19 of metal pillar should be aligned vertically. However, they are respectively formed in different photolithography processes of the molding compound layer 16 and the dielectric material layer 17 in the existing FCCSP fabrication, so there may be location deviations between the two segments 18 and 19 caused by the possible photo-mask misalignments among the photolithography processes. Also, the affinity between the primer material and either the metal pillar or the molding compound may not strong enough. These may make yield rate and reliability of the product worse. Therefore, it is in need to develop a new means for fabricating package substrates.

TECHNICAL SUMMARY

According to one aspect of the present disclosure, one embodiment provides a package substrate, which includes: a first wiring layer having a first metal wire and a first dielectric material layer filling the remaining part of the first wiring layer except for the first metal wire; a conductive pillar layer formed on the first wiring layer and including a metal pillar connected to the first metal wire, a molding compound layer with a protrusion part surrounding the metal pillar, and a second dielectric material layer formed on the molding compound layer; a second wiring layer formed on the conductive pillar layer and including a second metal wire connected to the metal pillar; and a protection layer formed on the second wiring layer.

According to one aspect of the present disclosure, one embodiment provides a flip-chip package circuit, which includes: a first wiring layer having a first metal wire and a first dielectric material layer filling the remaining part of the first wiring layer except for the first metal wire; a conductive pillar layer formed on the first wiring layer and including a metal pillar connected to the first metal wire, a molding compound layer with a protrusion part surrounding the metal pillar, and a second dielectric material layer formed on the molding compound layer; a second wiring layer formed on the conductive pillar layer and including a second metal wire connected to the metal pillar; a protection layer formed on the second wiring layer and having an opening exposing the second metal wire; a circuit chip disposed under the first wiring layer and electrically connected to the first metal wire; and a printed circuit board disposed on the protection layer and electrically connected to the second metal wire through the opening of the protection layer.

According to one aspect of the present disclosure, one embodiment provides a package substrate, which includes: (A) providing a carrier; (B) forming a first wiring layer on the carrier, wherein the first wiring layer includes a first metal wire and a first dielectric material layer filling the remaining part of the first wiring layer except for the first metal wire; (C) forming a metal pillar on the first wiring layer, so that the metal pillar is connected to the first metal wire; (D) forming a molding compound layer on the carrier, so that the molding compound layer completely covers the first wiring layer and the metal pillar on the carrier; (E) removing a part of the molding compound layer, so that the remaining part of the molding compound layer includes a first area having an upper surface lower than the top surface of the metal pillar and a second area surrounding the metal pillar; (F) forming a second dielectric material layer on the remaining part of the molding compound layer, so that the upper surface of the second dielectric material layer is higher than the top surface of the metal pillar; (G) removing a part of the second dielectric material layer and/or the molding compound layer, so that the top surface of the metal pillar is exposed; (H) forming a second wiring layer including a second metal wire on the second dielectric material layer, so that the second metal wire is connected to the metal pillar; and (I) forming a protection layer on the second wiring layer, and removing the carrier.

In one embodiment, the protrusion part has an increasing width from top to bottom.

In one embodiment, the protrusion part has a concave side wall.

In one embodiment, the metal pillar has a side surface completely covered by the second area of the molding compound layer.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For further understanding and recognizing the fulfilled functions and structural characteristics of the disclosure, several exemplary embodiments cooperating with detailed description are presented as the following. Reference will now be made in detail to the preferred embodiments, examples of which are illustrated in the accompanying drawings.

In the following description of the embodiments, it is to be understood that when an element such as a layer (film), region, pattern, or structure is stated as being "on" or "under" another element, it can be "directly" on or under another element or can be "indirectly" formed such that an intervening element is also present. Also, the terms such as "on" or "under" should be understood on the basis of the drawings, and they may be used herein to represent the relationship of one element to another element as illustrated in the figures. It will be understood that this expression is intended to encompass different orientations of the elements in addition to the orientation depicted in the figures, namely, to encompass both "on" and "under". In addition, although the terms "first", "second" and "third" are used to describe various elements, these elements should not be limited by the term. Also, unless otherwise defined, all terms are intended to have the same meaning as commonly understood by one of ordinary skill in the art.

Figure 2:
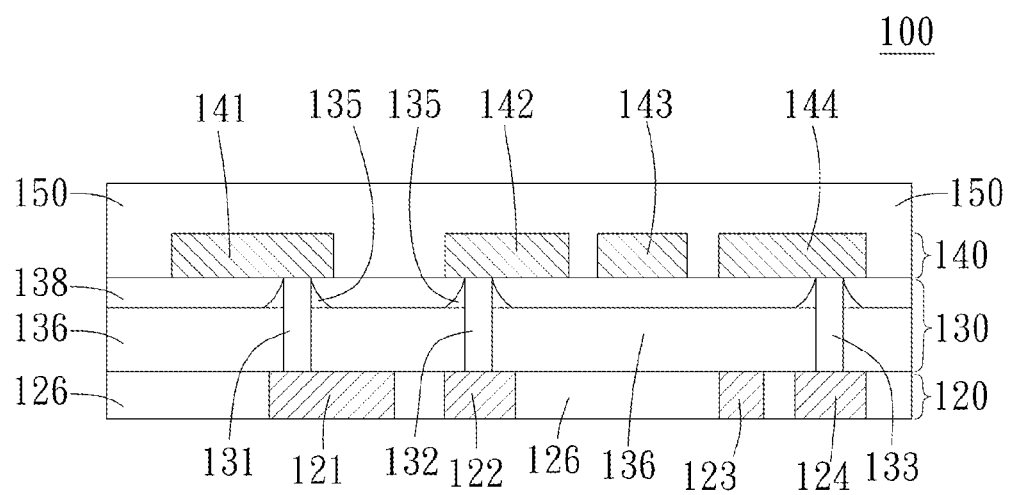
FIG. 2 is a cross-sectional view of a package substrate according to one embodiment of the present disclosure.

FIG. 2 schematically shows a cross-sectional view of a package substrate 100 according to one embodiment of the present disclosure. The package substrate 100 includes a first wiring layer 120, a conductive pillar layer 130, a second wiring layer 140, and a protection layer 150. The first wiring layer 120 includes a first dielectric material layer 126 and at least one first metal wire 121-124, wherein the first metal wires 121-124 are formed by patterning a metal layer acting as lower-layer conductive wires of the package substrate 100. The first dielectric material layer 126 fills the remaining part of the first wiring layer 120, other than the first metal wires 121-124.

The conductive pillar layer 130 includes at least one metal pillar 131-133, a molding compound layer 136 with a protrusion part 135, and a second dielectric material layer 138; wherein, the metal pillars 131-133 are formed by patterning a metal layer and used to connect the first wiring layer 120 and the second wiring layer 140. As shown in FIG. 2, the molding compound layer 136 is formed directly on the first wiring layer 120, and the metal pillars 131, 132 and 133 are connected to the first metal wire 121, 122 and 124, respectively. The second dielectric material layer 138 is formed on the molding compound layer 136. The molding compound layer 136 surrounds the metal pillars 131-133, with their upper part surrounded by the protrusion part 135. The molding compound layer 136 and the second dielectric material layer 138 together occupy the remaining part of the conductive pillar layer 130, other than the occupation of the metal pillars 131-133. The molding compound layer 136 can be made of insulating material suitable for molding, such as epoxy-based-resin molding compound (EMC) and polyimide. Also, the second dielectric material layer 138 can be made of epoxy-based resin or polyimide. In one embodiment, the first dielectric material layer 126 may be made of a material which is used to form the molding compound layer 136; that is to say, the occupation area of the first dielectric material layer 126 in FIG. 2 can be filled with the composition material of the molding compound layer 136.

The second wiring layer 140, including at least one second metal wire 141-144, can be formed on the conductive pillar layer 130; wherein the second metal wires 141-144 are formed by patterning a metal layer acting as upper-layer conductive wires of the package substrate 100. The second metal wires 141, 142 and 144 are connected to the metal pillars 131, 132 and 133, respectively. In the embodiment, the metal pillars 131-133 can be made of copper, so as to electrically connect the second wiring layer 140 (the upper circuit layer) and the first wiring layer 120 (the lower circuit layer). Moreover, the protection layer 150 is formed of insulating material on the second wiring layer 140, to be the outermost part or the bottom of the package substrate 100. The protection layer 150 can be used to protect the package substrate 100 from being damaged by external objects or the subsequent fabrication process like soldering. The package substrate 100 can be a flip-chip chip size package (FCCSP) substrate used to construct the so-called "molded interconnection substrate (MIS)".

Figure 1:
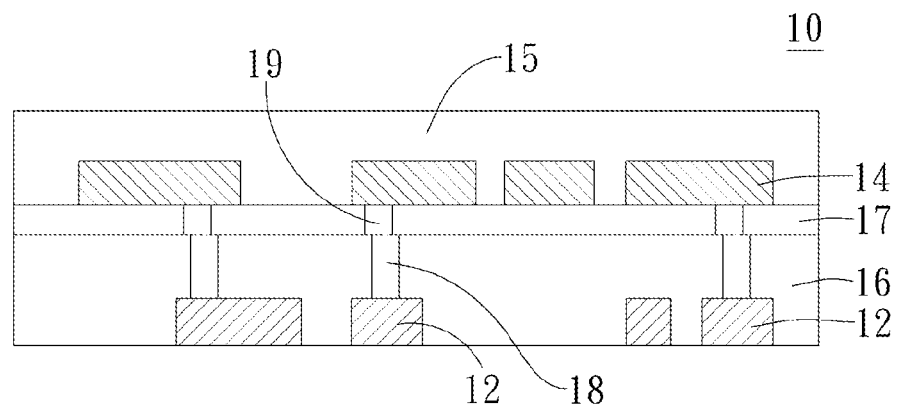
FIG. 1 shows a cross-sectional view of a prior-art package substrate.

In the existing FCCSP fabrication, a photo-sensitive primer material is used in the formation of the dielectric material layer on the molding compound layer, so it is highly required to have an enough resolution of photolithography in the fabrication process. Especially for the package manufacturing process of fine pitch, the primer material is expensive and restricted to some specific chemical compositions. As shown in FIG. 1, each of the metal pillars may include an upper segment 19 in the dielectric material layer 17 and a lower segment 18 in the conductive pillar layer 16, which are respectively formed in different photolithography processes of the molding compound layer 16 and the dielectric material layer 17. There may be location deviations between the two segments 18 and 19 caused by the possible photomask misalignments among the photolithography processes. Also, the affinity between the primer material and either the metal pillar or the molding compound may not strong enough. These may make yield rate and reliability of the product worse. To avoid the above-described problems, we design a package substrate 100 as shown in FIG. 2 in the present disclosure. The molding compound layer 136 can be divided into two areas, a first area A and a second area B, as shown in FIG. 4E. The part of the molding compound layer 136 in the second area B is higher than that in the first area A, and the difference therebetween is the protrusion part 135 which surrounds the upper part of the metal pillars 131-133. That is to say, side surfaces of the metal pillars 131-133 are completely covered by the molding compound layer 136 in the second area B. In the embodiments, the protrusion part 135 may have an increasing width from top to bottom, with its upper-part narrower than its lower-part. Preferably, the protrusion part 135 may have a hyperbolic or parabolic concave side wall. Thus, the metal pillars 131-133 can be formed in only one single photolithography step by adopting proper composition material for both of the molding compound layer 136 and the second dielectric material layer 138 as well as setting up a proper fabrication process for the conductive pillar layer 130.

Figure 3:
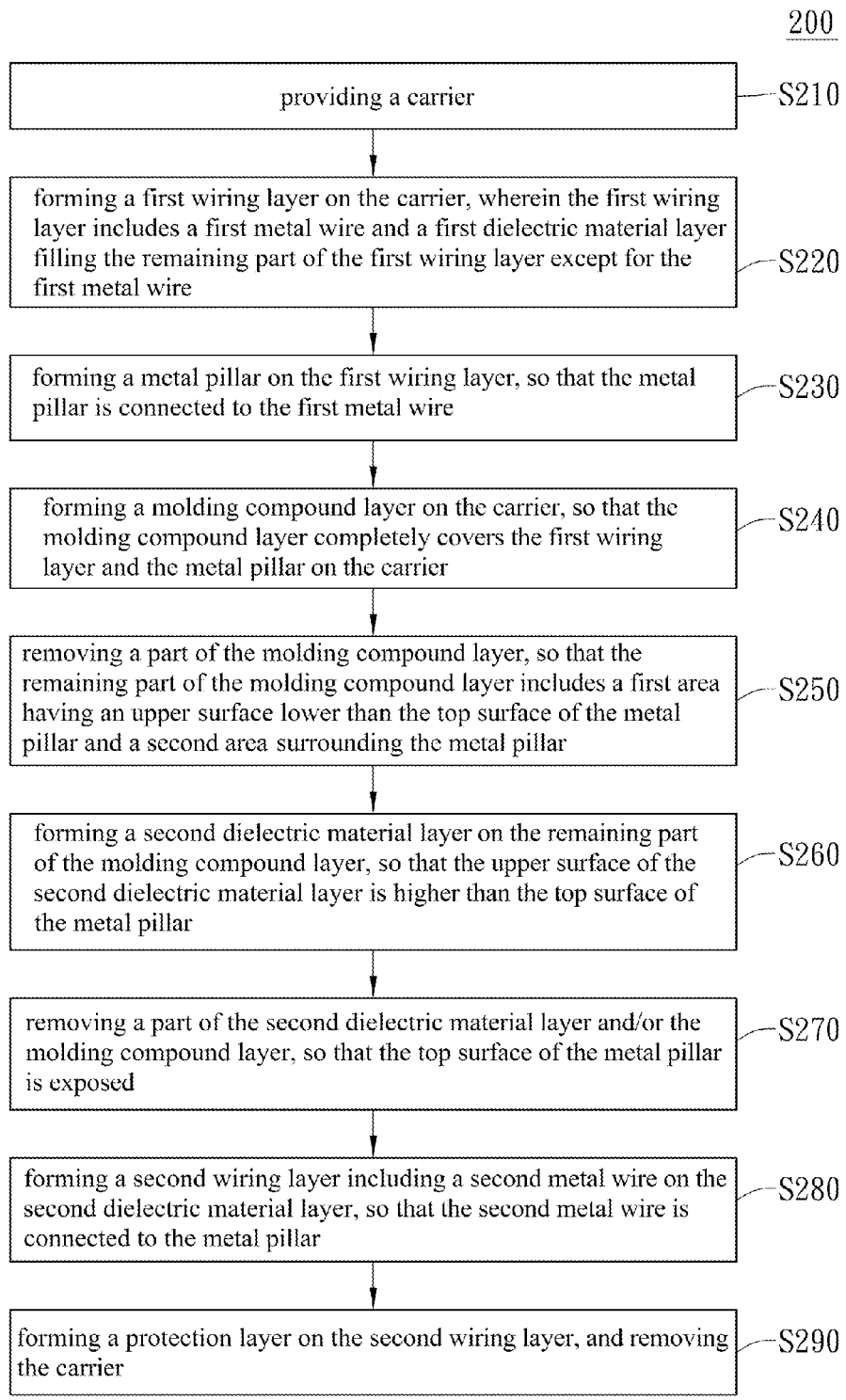
FIG. 3 is a flowchart of a method for fabricating a package substrate.

FIG. 3 shows a flowchart of a method 200 for fabricating a package substrate, and FIG. 4A to 4H are cross-sectional views of the package substrate according to the embodiment of FIG. 2 in the present disclosure, corresponding to steps S210 to S290 in the fabrication process. The method 200 will be described in detail in the following paragraphs.

At step S210, a carrier 110 is provided as shown in FIG. 5A to carry and support electronic components and conductive wires of the package substrate 100, e.g. the first wiring layer 120, the conductive pillar layer 130, the second wiring layer 140, and the protection layer 150 in FIG. 2. The carrier 110 can be made of metal (such as Fe, Fe/Ni, Cu, and Al) or fiberglass in the embodiment.

At step S220, a first wiring layer 120 is formed on the carrier 110 and then patterned to be a lower-layer part of the conductive wires of the package substrate 100, as shown in FIG. 5B. The first wiring layer 120 can be made of Cu, Al or Ni and formed by evaporating or electrolytic plating. The first wiring layer 120 can be patterned by the photolithography. For example, a first photoresist layer (not shown) can be deposited on the carrier 110 by laminating or spin-coating, and it would be patterned by exposure to light and developing. Then, a first metal layer (not shown) is deposited on the patterned first photoresist layer. By using the lift-off processing, the patterned first photoresist layer can be washed out together with the part of the first metal layer directly on its top surface, and the remainder of the first metal layer not on the patterned first photoresist layer stays on the carrier 110 to be the first metal wires 121-124 in the first wiring layer 120. Also, this step S220 can be realized by the Laser process. For example, a first metal layer (not shown) can be deposited on the carrier 110. The first metal layer can be partly removed by the Laser engraving so that the remainder staying on the carrier 110 becomes the first metal wires 121-123 in the first wiring layer 120. Then, a first dielectric material layer 126 may be formed on the carrier 110 to fill the remaining part of the first wiring layer 120 other than the first metal wires 121-124 therein.

Figure 4A:
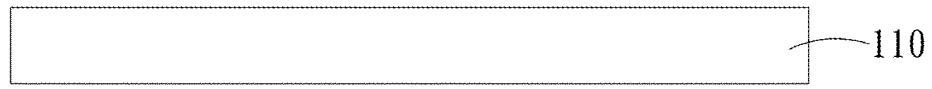
FIG. 4A to 4H are cross-sectional views of the package substrate according to the embodiment of FIG. 2 of the present disclosure, corresponding to different steps in the fabrication process.
Figure 4B:
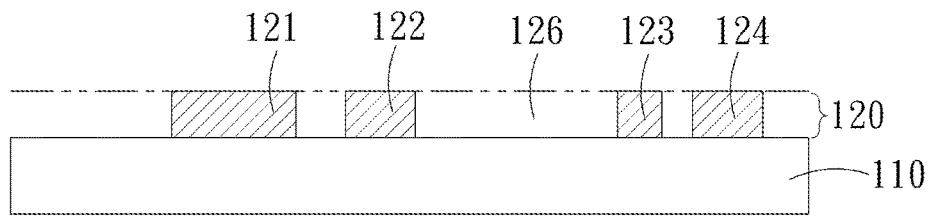
Figure 4C:
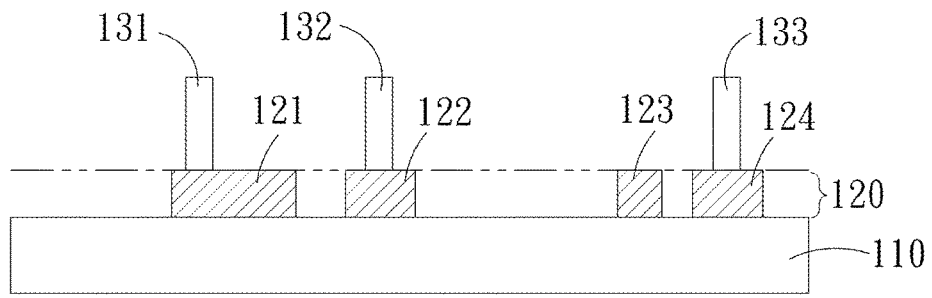

At step S230, a conductive pillar layer 130 is formed on the first wiring layer 120 and then patterned to be a plurality of metal pillars 131-133 as shown in FIG. 4C. The metal pillars 131-133 are used to electrically connect the first wiring layer 120 and the second wiring layer 140 to be processed in the subsequent fabrication steps. The metal pillars 131-133 can be made of Cu or Al and formed by evaporating or electrolytic plating. The conductive pillar layer 130 can be patterned by the photolithography. For example, a second photoresist layer (not shown) can be deposited on both the carrier 110 and the first wiring layer 120 by laminating dry film photoresist, and it would be patterned by exposure to light and developing. Then, a second metal layer (not shown) is deposited on the patterned second photoresist layer. By using the lift-off processing, the patterned second photoresist layer can be removed out together with the part of the second metal layer directly on its top surface, and the remainder of the second metal layer not on the patterned second photoresist layer stays on the first wiring layer 120 to be the metal pillars 131-133 in the conductive pillar layer 130.

Figure 4D:
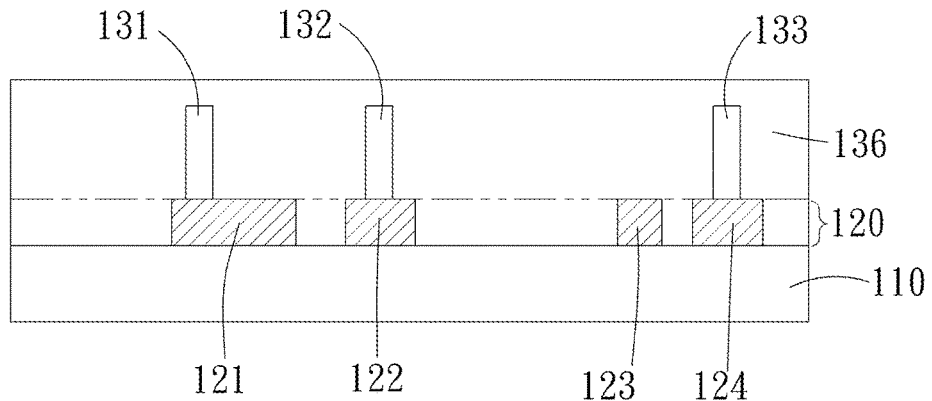
Figure 4E:
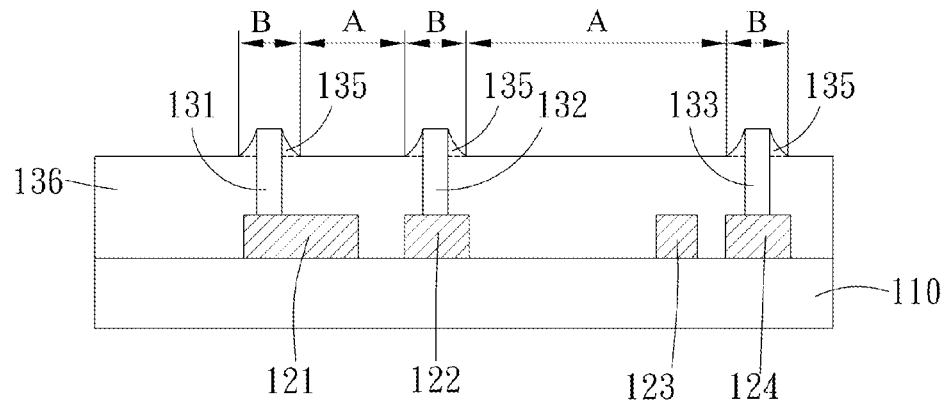

At step S240, a molding compound layer 136 is formed on the carrier 110 as shown in FIG. 4D, and it covers all the top surface of the carrier 110 including all of the first metal wires 121-124 and the metal pillars 131-133. The molding compound layer 136 act as an isolation member between the first wiring layer 120 and the second wiring layer 140, and it can be formed of insulating material suitable for molding (e.g. compression molding, transferring molding, and injection molding), such as epoxy-based-resin EMC. For example, a molding compound (not shown) is provided in a mold container (not shown). The mold container corresponds with the carrier 110 properly, so that the first metal wires 121-124 and the metal pillars 131-133 are all located between the mold container and the carrier 110. Then, a downward pressure is applied to the carrier 110 and an upward pressure is applied to the mold container. The pressures are maintained until the molding compound has cured to be the molding compound layer 136 as shown in FIG. 4D. The mold container can be removed after that. Alternatively, the molding compound layer 140 can be compression-molded in another way. At first, a mold container (not shown) and a molding compound (not shown) in the form of powder or sheet are provided. The molding compound can be melted by heating and loaded into the mold container. Then the mold container and the carrier 110 are arranged correspondingly, so that the first metal wires 121-124, the metal pillars 131-133 and the molding compound are located between the mold container and the carrier 110. Then a downward pressure is applied to the carrier 110 and an upward pressure is applied to the mold container. The pressures are maintained until the molding compound has cured to be the molding compound layer 136 as shown in FIG. 4D. The mold container can be removed after that. The molding compound can be made of insulating material suitable for compression molding, such as novolac-based resin, epoxy-based resin, and silicone-based resin; but is not limited thereto. In the embodiment, epoxy-based-resin EMC is used for the molding compound layer 136.

At step S250, the molding compound layer 136 is partly removed, so that the remaining part of the molding compound layer 136 includes a first area A and a second area B as shown in FIG. 4E. The first area A has an upper surface lower than the top surface of the metal pillars 131-133, and the second area B surrounds the metal pillars 131-133. This step can be performed by polishing, grinding, sandblasting, plasma or chemical etching. The part of the molding compound layer 136 in the second area B is higher than that in the first area A, and the difference therebetween is the protrusion part 135 which surrounds the upper part of the metal pillars 131-133. That is to say, side surfaces of the metal pillars 131-133 are completely covered by the molding compound layer 136 in the second area B. In the embodiments, the protrusion part 135 may have an increasing width from top to bottom, with its upper-part narrower than its lower-part. Preferably, the protrusion part 135 may have a hyperbolic or parabolic concave side wall.

Figure 4F:
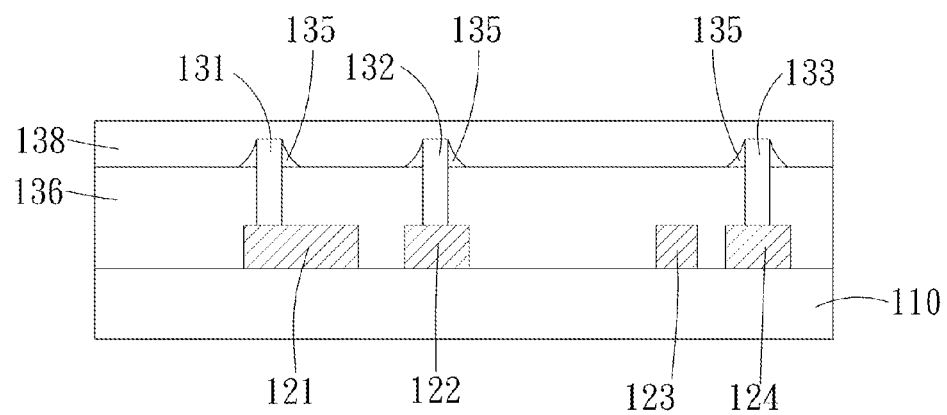

At step S260, a second dielectric material layer 138 can be formed on the molding compound layer 136 as shown in FIG. 4F, so that the top surface of the second dielectric material layer 138 is higher than the top surface of the metal pillars 131-133. For example, the second dielectric material layer 138 can be deposited by laminating or spin-coating, so that the second dielectric material layer 138 covers all of the molding compound layer 136 and the metal pillars 131-133. The second dielectric material layer 138 can be made of epoxy-based resin or polyimide.

Figure 4G:
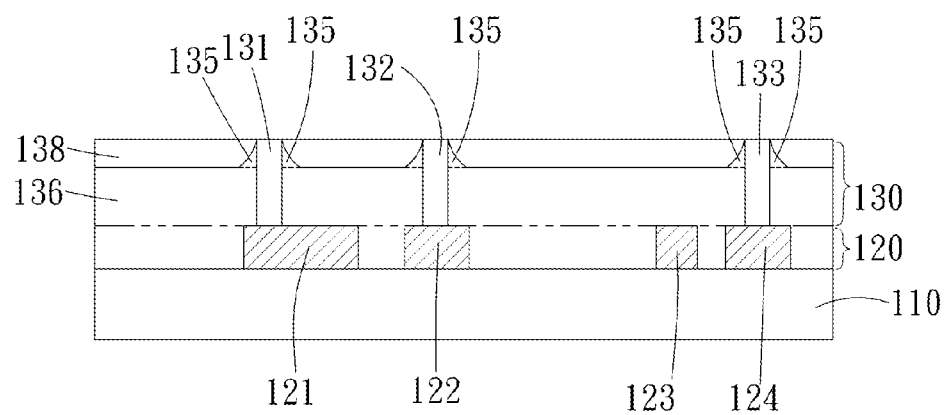

At step S270, The second dielectric material layer 138 can be partly removed so that the top surface of the metal pillars 131-133 is exposed, as shown in FIG. 4G. If there are still some residues of the molding compound layer 136 staying on the top surface of the metal pillars 131-133, this step would remove it along with the partly removed second dielectric material layer 138 to expose the top surface of the metal pillars 131-133. The molding compound layer 136 and the second dielectric material layer 138 together cover all the first metal wires 121-124 and the metal pillars 131-133 on the carrier 110. They act as an insulation member between the first wiring layer 120 and the second wiring layer 140, and the metal pillars 131, 132 and 133 are used to connect the first metal wires 121, 122 and 124 with the second metal wires 141, 142 and 144, respectively. Thus, the upper part of the second dielectric material layer 138 and/or the molding compound layer 136 over the top surface of the metal pillars 131-133 has to be removed to expose the top surfaces of the metal pillars 131-133. The removal can be realized by polishing, grinding, sandblasting, plasma or chemical etching. The second dielectric material layer 138 and/or the molding compound layer 136 are/is polished to remove their/its upper part downwards until the exposure of the top surfaces of the metal pillars 131-133. The metal pillars 131-133, the molding compound layer 136 and the second dielectric material layer 138 are combined to be the conductive pillar layer 130.

Figure 4H:
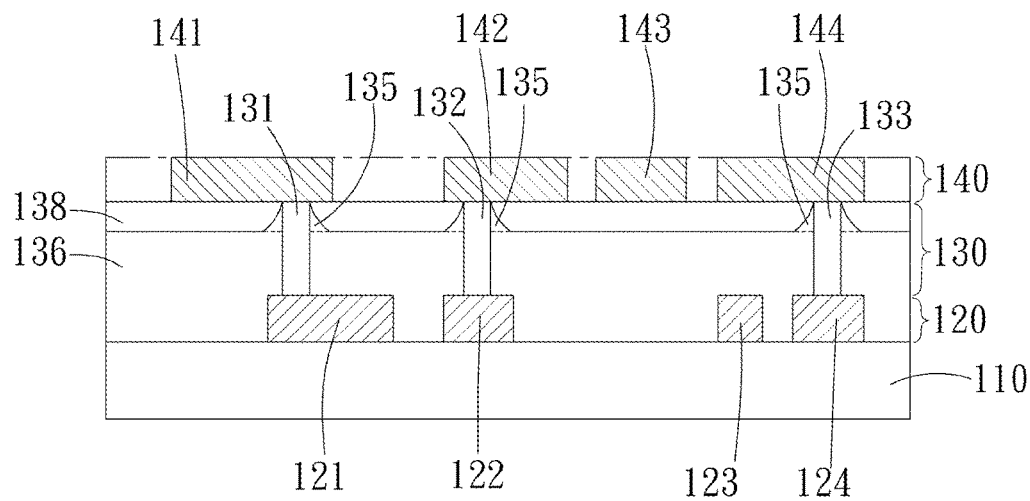

At step S280, a second wiring layer 140 is formed on the second dielectric material layer 138 and the exposed top surfaces of the metal pillars 131-133, and then patterned to be upper-layer conductive wires of the package substrate 100, including second metal wires 141-144 as shown in FIG. 4H. The second wiring layer 140 can be made of Cu, Al or Ni and formed by evaporating or electrolytic plating. The second wiring layer 140 can be patterned by the photolithography. For example, a third photoresist layer (not shown) can be deposited on the second dielectric material layer 138 by spin-coating, and it would be patterned by exposure to light and developing. Then, a third metal layer (not shown) is deposited on the patterned third photoresist layer. By using the lift-off processing, the patterned third photoresist layer can be washed out together with the part of the third metal layer directly on its top surface, and the remainder of the third metal layer not on the patterned third photoresist layer stays on the second dielectric material layer 138 to be the second metal wires 141-144 in the second wiring layer 140. The second metal wires 141, 142 and 144 are connected to the metal pillars 131, 132 and 133, respectively.

At step S290, a protection layer 150 is formed on the second wiring layer 140 and the second dielectric material layer 138. The protection layer 150 is used to electrically insulate the neighboring conductive wires in the second wiring layer 140 and to protect the second wiring layer 140 from being damaged by external objects or the subsequent fabrication process. Moreover, the package substrate 100 of the embodiment can be further processed to be a packaged integrated-circuit device. Before that, the carrier 110 can be removed, as shown in FIG. 2. In the embodiment, the first dielectric material layer 126 is made of a material which is used to form the molding compound layer 136. Alternatively, the so-called "backend processing" can be applied to the package substrate 100 of the above embodiments. For example, the lower part of the carrier 110 can be partly removed by using the photolithography to form an opening window (not shown) exposing the first wiring layer 120, so that an external electronic device (not shown) can be mounted in the opening window with electrical connection to the first metal wires 121-124.

Figure 5:
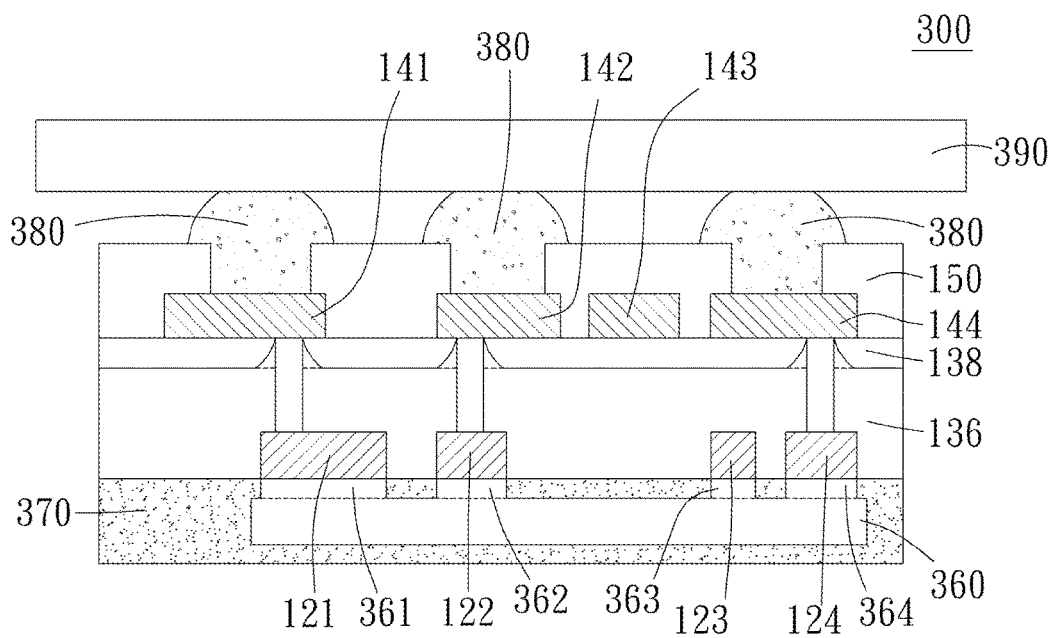
FIG. 5 schematically shows a cross-sectional view of a flip-chip package circuit according to one embodiment of the present disclosure.

The package substrate 100 can be further processed to fabricate a package circuit device. FIG. 5 schematically shows a cross-sectional view of a flip-chip package circuit 300 according to one embodiment of the present disclosure. The flip-chip package circuit 300 includes a package substrate, a circuit chip 360, and a printed circuit 390. The package substrate is basically the package substrate 100 in FIG. 2. The circuit chip 360 is disposed under the package substrate 100, and it has plural connection pins 361-364 electrically connected to the first metal wires 121-124, respectively. The circuit chip 360 is disposed on the first wiring layer 120 of the package substrate 100 in the flip-chip way, and a package material 370 is then used to package the circuit chip 360 and the lower part of the package substrate 100 together. Regarding the upper part of the package substrate 100, the protection layer 150 can be properly patterned by the photolithography, so as to form openings for the electrical connection between the second wiring layer 140 and an external circuit. Thus, the printed circuit 390 can be bonded to the second metal wires 141, 142 and 144 through the openings of the protection layer 150 and the electrical connection members (e.g. the solder balls 380 as shown in FIG. 5) therein.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A package substrate comprising:
   a first wiring layer having a first metal wire and a first dielectric material layer filling a remaining part of the first wiring layer, wherein the remaining part is a space of the first wiring layer not occupied by the first metal wire;
   a conductive pillar layer formed on the first wiring layer and including a metal pillar connected to the first metal wire, a molding compound layer with a protrusion part surrounding the metal pillar, and a second dielectric material layer formed on the molding compound layer;
   a second wiring layer formed on the conductive pillar layer and including a second metal wire connected to the metal pillar; and
   a protection layer formed on the second wiring layer;
   wherein, the protrusion part has an increasing width from top to bottom.

2. The package substrate according to claim 1, wherein the package substrate is a flip-chip chip size package (FCCSP) substrate.

3. The package substrate according to claim 1, wherein the molding compound layer comprises epoxy-based resin or polyimide.

4. The package substrate according to claim 1, wherein the second dielectric material layer comprises epoxy-based resin or polyimide.

5. The package substrate according to claim 1, wherein the protrusion part has a concave side wall.

6. The package substrate according to claim 1, wherein the metal pillar has a side surface completely covered by the molding compound layer.

7. A flip-chip package circuit comprising:
   a first wiring layer having a first metal wire and a first dielectric material layer filling the remaining part of the first wiring layer except for the first metal wire;
   a conductive pillar layer formed on the first wiring layer and including a metal pillar connected to the first metal wire, a molding compound layer with a protrusion part surrounding the metal pillar, and a second dielectric material layer formed on the molding compound layer;

a second wiring layer formed on the conductive pillar layer and including a second metal wire connected to the metal pillar;

a protection layer formed on the second wiring layer and having an opening exposing the second metal wire;

a circuit chip disposed under the first wiring layer and electrically connected to the first metal wire; and a printed circuit board disposed on the protection layer and electrically connected to the second metal wire through the opening of the protection layer;

wherein, the protrusion part has an increasing width from top to bottom.

8. The flip-chip package circuit according to claim 7, wherein the protrusion part has a concave side wall.

9. The flip-chip package circuit according to claim 7, wherein the metal pillar has a side surface completely covered by the molding compound layer.

* * * * *